(12) United States Patent
Nitta (10) Patent No.: US 12,453,270 B2
(45) Date of Patent: Oct. 21, 2025

(54) DISPLAY DEVICE AND MANUFACTURING METHOD OF DISPLAY DEVICE

(71) Applicant: Magnolia White Corporation, Tokyo (JP)

(72) Inventor: Jun Nitta, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 538 days.

(21) Appl. No.: 17/969,701

(22) Filed: Oct. 20, 2022

(65) Prior Publication Data

US 2023/0130794 A1 Apr. 27, 2023

(30) Foreign Application Priority Data

Oct. 21, 2021 (JP) ................................. 2021-172360

(51) Int. Cl.
| | |
|---|---|
| *H10K 59/122* | (2023.01) |
| *H10K 50/813* | (2023.01) |
| *H10K 50/818* | (2023.01) |
| *H10K 71/00* | (2023.01) |
| *H10K 59/12* | (2023.01) |

(52) U.S. Cl.
CPC ......... *H10K 59/122* (2023.02); *H10K 50/813* (2023.02); *H10K 50/818* (2023.02); *H10K 71/00* (2023.02); *H10K 59/12* (2023.02)

(58) Field of Classification Search
CPC .... H10K 59/122; H10K 71/00; H10K 50/818; H10K 50/813
USPC .......................................................... 257/40
See application file for complete search history.

(56) References Cited

U.S. PATENT DOCUMENTS

| | | | |
|---|---|---|---|
| 2021/0143222 A1* | 5/2021 | Song | ..................... H10K 59/123 |
| 2022/0190045 A1* | 6/2022 | Lee | ......................... H10K 71/50 |
| 2022/0351539 A1* | 11/2022 | Hai | ....................... H10K 59/122 |

FOREIGN PATENT DOCUMENTS

JP          2003-168559 A     6/2003

* cited by examiner

*Primary Examiner* — Xia L Cross
(74) *Attorney, Agent, or Firm* — XSENSUS LLP (57) ABSTRACT

According to one embodiment, a display device includes a first insulating layer, a bottom electrode provided on the first insulating layer, a second insulating layer provided on the first insulating layer and having an opening penetrating to the bottom electrode, an adhesive layer provided in the opening, having conductivity and being in contact with the bottom electrode, a reflecting electrode attached to the adhesive layer, an organic layer including a light emitting layer and provided on the reflecting electrode, a third insulating layer provided on the second insulating layer, and covering a side surface of the reflecting electrode and a side surface of the organic layer, and a top electrode provided on the organic layer and the third insulating layer.

15 Claims, 11 Drawing Sheets

DISPLAY DEVICE AND MANUFACTURING METHOD OF DISPLAY DEVICE

CROSS-REFERENCE TO RELATED APPLICATIONS

This application is based upon and claims the benefit of priority from Japanese Patent Application No. 2021-172360, filed Oct. 21, 2021, the entire contents of which are incorporated herein by reference.

FIELD

Embodiments described herein relate generally to a display device and a manufacturing method of a display device.

BACKGROUND

Recently, a display device which applies an organic light emitting diode (OLED) as a display element has been put into practical use. The display element comprises an organic layer between a pixel electrode and a common electrode. The organic layer includes a light emitting layer and functional layers such as a hole transport layer and an electron transport layer. This organic layer is formed by, for example, a vacuum deposition method.

For example, in case of mask deposition, a fine mask which comprises an opening corresponding to each pixel is applied. However, when the fine mask is applied, the yield may be decreased by the attachment of foreign substances. Thus, the formation of an organic layer having a desired shape without applying a fine mask is required.

For example, the following technique is known. An OLED donor film comprising a photothermal conversion layer and a transfer layer is applied. Transfer energy by light or heat is emitted to transfer the transfer layer onto a substrate.

DETAILED DESCRIPTION

In general, according to one embodiment, a display device comprises an insulating substrate, a first insulating layer provided on the insulating substrate, a bottom electrode provided on the first insulating layer, a second insulating layer provided on the first insulating layer and comprising an opening penetrating the second insulating layer such that the bottom electrode is exposed, an adhesive layer which is provided in the opening, has conductivity and is in contact with the bottom electrode, a reflecting electrode attached to the adhesive layer, an organic layer including a light emitting layer and provided on the reflecting electrode, a third insulating layer provided on the second insulating layer, and covering a side surface of the reflecting electrode and a side surface of the organic layer, and a top electrode provided on the organic layer and the third insulating layer.

According to another embodiment, a manufacturing method of a display device comprises forming a second insulating layer comprising an opening penetrating the second insulating layer such that a bottom electrode on a first insulating layer is exposed, filling the opening with an adhesive layer having conductivity, preparing a sheet in which an organic layer including a light emitting layer and a reflecting electrode are stacked in this order on a support body, attaching the sheet such that the reflecting electrode is in contact with the adhesive layer, detaching the support body, forming a third insulating layer covering a side surface of each of the organic layer and the reflecting electrode, and forming a top electrode on the organic layer and the third insulating layer.

Embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis are shown depending on the need, and they are orthogonal to each other. A direction parallel to the X-axis is referred to as an X-direction or a first direction. A direction parallel to the Y-axis is referred to as a Y-direction or a second direction. A direction parallel to the Z-axis is referred to as a Z-direction or a third direction. The plane defined by the X-axis and the Y-axis is referred to as an X-Y plane. When the X-Y plane is viewed, the appearance is defined as a plan view.

According to an embodiment, a display device DSP is an organic electroluminescent display device comprising an organic light emitting diode (OLED) as a display element, and is mounted on televisions, personal computers, mobile terminals, mobile phones and the like. It should be noted that the display element explained below can be applied as a light emitting element of an illumination device. The display device DSP can be used for another electronic device such as an illumination device.

Figure 1:
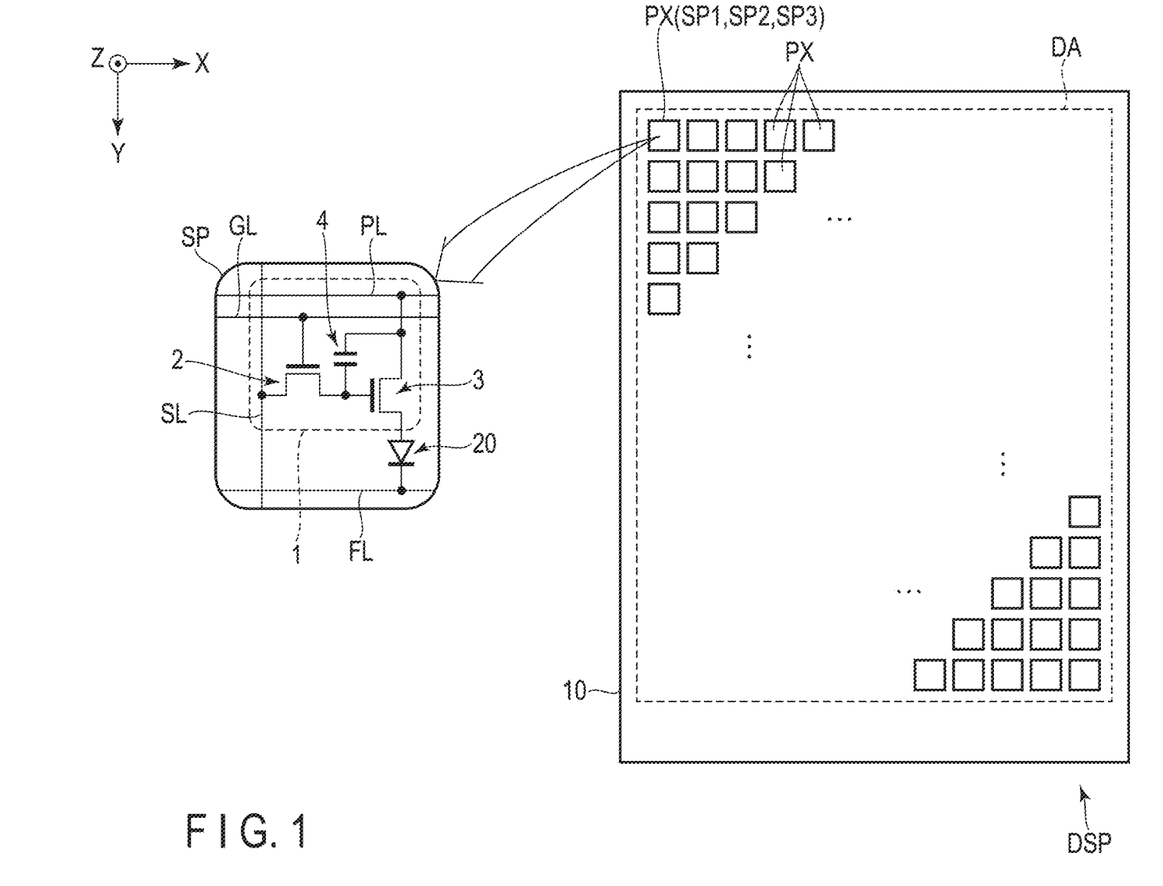
FIG. 1 is a diagram showing a configuration example of a display device DSP according to an embodiment.

FIG. 1 is a diagram showing a configuration example of a display device DSP according to an embodiment.

The display device DSP comprises, on an insulating substrate 10, a display portion DA which displays an image. The insulating substrate 10 may be a glass substrate or may be a resinous film having flexibility.

The display portion DA comprises a plurality of pixels PX arrayed in matrix in a first direction X and a second direction Y. Each pixel PX comprises a plurality of subpixels SP1, SP2 and SP3. For example, each pixel PX comprises a red subpixel SP1, a green subpixel SP2 and a blue subpixel SP3. It should be noted that each pixel PX may comprise four or more subpixels. Specifically, in addition to the subpixels of the above three colors, each pixel PX may comprise a subpixel which exhibits other color such as white. The combination of the colors of the subpixels which constitute each pixel PX is not limited to red, green and blue. The emission colors of the subpixels which constitute each pixel PX may be the same color (for example, white).

Now, this specification briefly explains a configuration example of a subpixel SP included in a pixel PX.

The subpixel SP comprises a pixel circuit 1, and a display element 20 which is driven and controlled by the pixel circuit 1. The pixel circuit 1 comprises a pixel switch 2, a drive transistor 3 and a capacitor 4. The pixel switch 2 and the drive transistor 3 are, for example, switch elements consisting of thin-film transistors.

Regarding the pixel switch 2, a gate electrode is connected to a scanning line GL, and a source electrode is connected to a signal line SL, and a drain electrode is connected to an electrode of the capacitor 4 and to the gate electrode of the drive transistor 3. Regarding the drive transistor 3, a source electrode is connected to the other electrode of the capacitor 4 and to a power line PL, and a drain electrode is connected to the anode of the display element 20. The cathode of the display element 20 is connected to a feed line FL. It should be noted that the configuration of the pixel circuit 1 is not limited to the example shown in the figure.

The display element 20 is an organic light emitting diode (OLED) which is an example of a light emitting element. For example, the subpixel SP1 comprises a display element which emits light corresponding to a red wavelength. The subpixel SP2 comprises a display element which emits light corresponding to a green wavelength. The subpixel SP3 comprises a display element which emits light corresponding to a blue wavelength. Multicolor display can be realized since the pixel PX comprises a plurality of subpixels SP1, SP2 and SP3 having different display colors.

The display elements 20 of subpixels SP1, SP2 and SP3 may be configured to emit the light of the same color. This configuration enables monochromatic display.

When the display element 20 of each of subpixels SP1, SP2 and SP3 is configured to emit white light, a color filter facing each display element 20 may be provided. For example, the subpixel SP1 comprises a red color filter facing the display element 20. The subpixel SP2 comprises a green color filter facing the display element 20. The subpixel SP3 comprises a blue color filter facing the display element 20. By this configuration, multicolor display can be realized.

Alternatively, when the display element 20 of each of subpixels SP1, SP2 and SP3 is configured to emit ultraviolet light, multicolor display can be realized by providing a light conversion layer facing the display elements 20.

Figure 2:
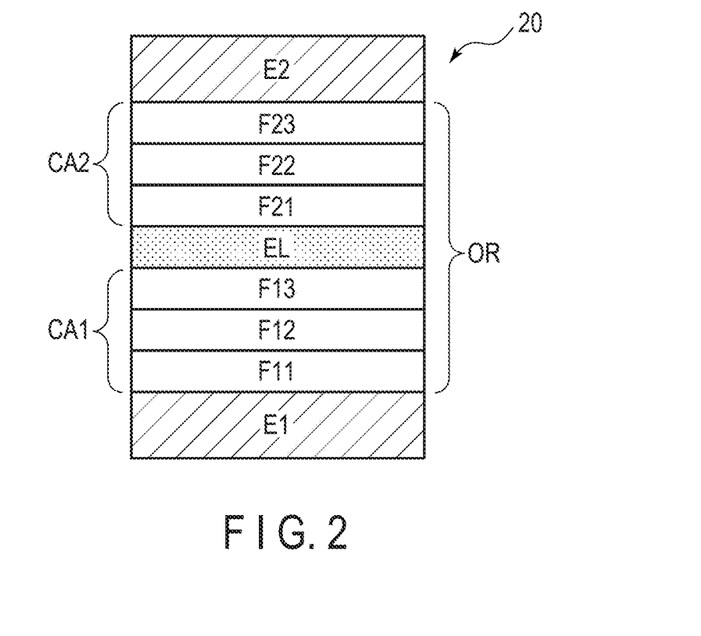
FIG. 2 is a diagram showing an example of the configuration of a display element 20.

FIG. 2 is a diagram showing an example of the configuration of the display element 20.

The display element 20 comprises a bottom electrode (first electrode) E1, an organic layer OR and a top electrode (second electrode) E2. The organic layer OR comprises a buffer layer (first buffer layer) CA1, a light emitting layer EL and a buffer layer (second buffer layer) CA2. The buffer layer CA1 is located between the bottom electrode E1 and the light emitting layer EL. The buffer layer CA2 is located between the light emitting layer EL and the top electrode E2. The buffer layers CA1 and CA2 include a plurality of functional layers.

Between the bottom electrode E1 and the buffer layer CA1, another conductive layer described later is provided. Here, the illustration of the conductive layer is omitted.

Here, this specification explains an example in which the bottom electrode E1 corresponds to an anode and the top electrode E2 corresponds to a cathode.

The buffer layer CA1 includes a hole injection layer F11, a hole transport layer F12, an electron blocking layer F13 and the like as functional layers. The hole injection layer F11 is provided on the bottom electrode E1. The hole transport layer F12 is provided on the hole injection layer F11. The electron blocking layer F13 is provided on the hole transport layer F12. The light emitting layer EL is provided on the electron blocking layer F13.

The buffer layer CA2 includes a hole blocking layer F21, an electron transport layer F22, an electron injection layer F23 and the like as functional layers. The hole blocking layer F21 is provided on the light emitting layer EL. The electron transport layer F22 is provided on the hole blocking layer F21. The electron injection layer F23 is provided on the electron transport layer F22. The top electrode E2 is provided on the electron injection layer F23, and is in contact with the electron injection layer F23. The electron injection layer is formed of, for example, lithium fluoride (LiF).

This specification explains an example in which the bottom electrode E1 corresponds to a cathode and the top electrode E2 corresponds to an anode.

The buffer layer CA1 includes the electron injection layer F11, the electron transport layer F12, the hole blocking layer F13 and the like as functional layers.

The buffer layer CA2 includes the electron blocking layer F21, the hole transport layer F22, the hole injection layer F23 and the like as functional layers. The hole blocking layer F21 is provided on the light emitting layer EL. The electron transport layer F22 is provided on the hole blocking layer F21. The electron injection layer F23 is provided on the electron transport layer F22. The top electrode E2 is provided on the electron injection layer F23.

It should be noted that the buffer layers CA1 and CA2 may include a functional layer such as a carrier generating layer other than the functional layers described above depending on the need.

In the buffer layers CA1 and CA2, at least one of the functional layers described above may be omitted. For example, at least one of the hole injection layer, the electron blocking layer, the hole blocking layer and the electron injection layer may be omitted.

Figure 3:
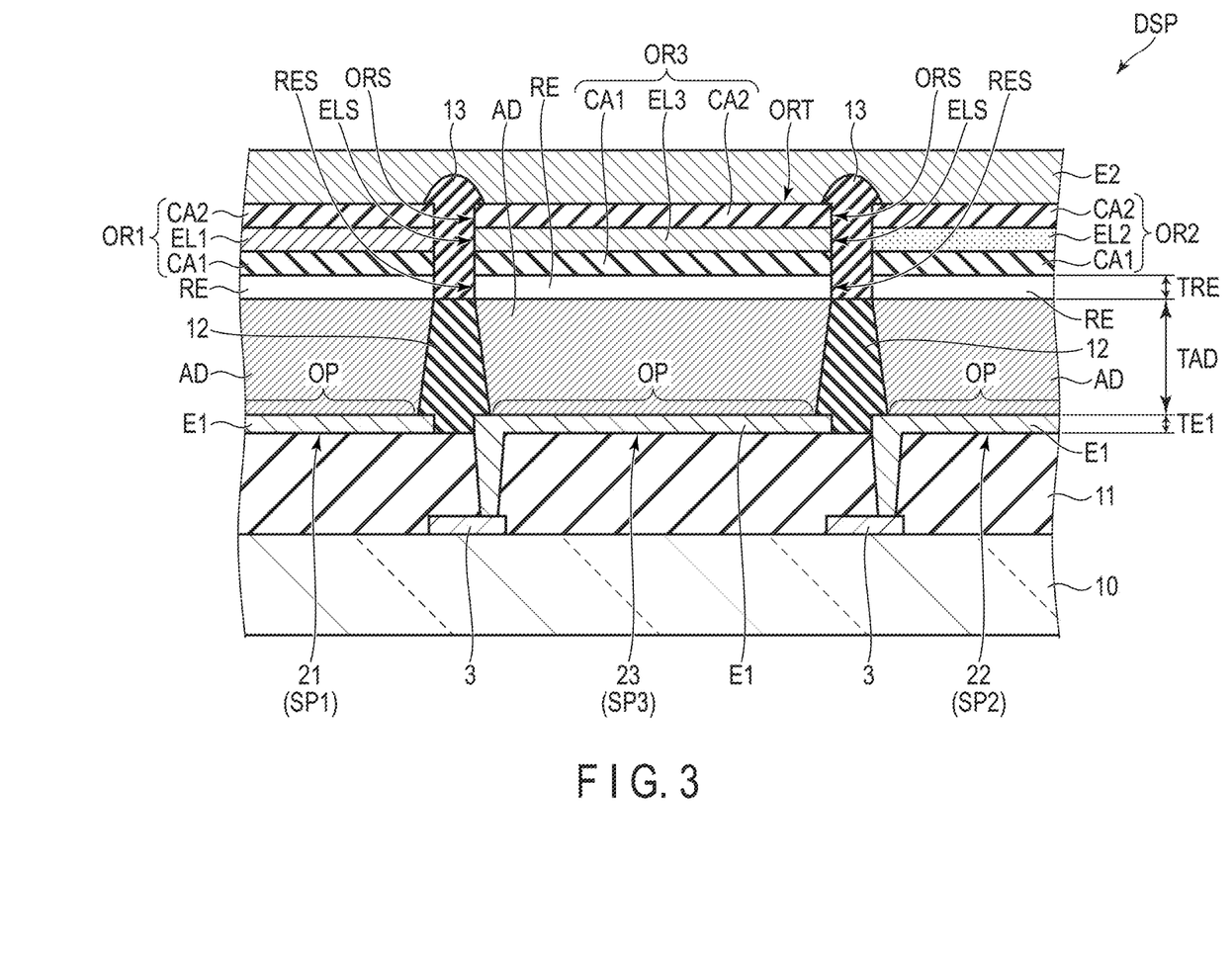
FIG. 3 is a cross-sectional view of the display device DSP shown in FIG. 1.

FIG. 3 is a cross-sectional view of the display device DSP shown in FIG. 1.

The display device DSP comprises the insulating substrate 10, an insulating layer (first insulating layer) 11, an insulating layer (second insulating layer) 12, an insulating layer (third insulating layer) 13, a display element 21, a display element 22 and a display element 23.

The display element 21 is a display element provided in a red subpixel SP1 and is partly shown in the figure. The display element 21 comprises a bottom electrode E1, an adhesive layer AD, a reflecting electrode RE, an organic layer OR1 including a light emitting layer EL1, and a top electrode E2.

The display element 22 is a display element provided in a green subpixel SP2 and is partly shown in the figure. The display element 22 comprises a bottom electrode E1, an adhesive layer AD, a reflecting electrode RE, an organic layer OR2 including a light emitting layer EL2, and a top electrode E2.

The display element 23 is a display element provided in a blue subpixel SP3. The display element 23 comprises a bottom electrode E1, an adhesive layer AD, a reflecting electrode RE, an organic layer OR3 including a light emitting layer EL3, and a top electrode E2.

It should be noted that the configurations of the display element 21 and the display element 22 are the same as the configuration of the display element 23 except for the organic layers. For this reason, this specification mainly explains the configuration of the display element 23 below.

The insulating layer 11 is provided on the insulating substrate 10 and corresponds to an underlayer of the display element 23. The insulating layer 11 covers the pixel circuit 1 shown in FIG. 1. FIG. 3 shows the drive transistor 3 of the pixel circuit 1. The insulating layer 11 is, for example, an organic insulating layer.

The bottom electrode E1 is provided on the insulating layer 11. The bottom electrode E1 is an electrode provided for each subpixel or each display element and is electrically connected to the drive transistor 3 shown in FIG. 1. This bottom electrode E1 may be referred to as a pixel electrode or an anode.

The bottom electrode E1 is a transparent electrode formed of, for example, a transparent conductive material such as indium tin oxide (ITO) or indium zinc oxide (IZO). The bottom electrode E1 may be a metal electrode formed of a metal material such as silver or aluminum. Alternatively, the bottom electrode E1 may be a stacked layer body of a transparent electrode and a metal electrode. For example, the bottom electrode E1 may be configured as a stacked layer body formed by stacking a transparent electrode, a metal electrode and a transparent electrode in order, or may be configured as a stacked layer body of three or more layers.

The insulating layer 12 is provided on the insulating layer 11. The insulating layer 12 is also provided between the adjacent bottom electrodes E1. The insulating layer 12 comprises an opening OP formed for each subpixel or each display element. The insulating layer 12 is formed so as to define the subpixels or display elements and may be referred to as a rib, partition, bank and the like. The insulating layer 12 is, for example, an organic insulating layer. For example, the insulating layer 12 is formed in a taper shape in which the width is reduced as the distance from the insulating layer 11 is increased.

The opening OP is formed in an area overlapping the bottom electrode E1, and is a through-hole which penetrates the insulating layer 12 such that the bottom electrode E1 is exposed. The peripheral portion of the bottom electrode E1 is covered with the insulating layer 12. The central portion of the bottom electrode E1 is exposed from the insulating layer 12 in the opening OP.

The adhesive layer AD is provided in the opening OP and is in contact with the bottom electrode E1. The adhesive layer AD is formed of a conductive material. The opening OP is filled with the adhesive layer AD. Subsequently, heat or light is applied to the adhesive layer AD such that the adhesive layer AD is cured. The adhesive layer AD is provided for each subpixel or each display element. In other words, the adhesive layer AD is provided in an area surrounded by the insulating layer 12. The adhesive layer AD does not exceed the insulating layer 12, and thus, the adhesive layer AD is not in contact with the adjacent bottom electrodes E1. In addition, the adhesive layer AD does not exceed the insulating layer 12, and is not in contact with the adjacent adhesive layers AD.

The reflecting electrode RE is attached to the adhesive layer AD. The reflecting electrode RE is formed of a conductive material. By this configuration, the bottom electrode E1 and the reflecting electrode RE are electrically connected to each other via the adhesive layer AD. The reflecting electrode RE is an electrode provided for each subpixel or each display element. Thus, the stacked layer body of the bottom electrode E1, the adhesive layer AD and the reflecting electrode RE constitutes a single pixel electrode. The reflecting electrode RE is formed of, for example, a metal material such as silver or aluminum.

When the insulating layer 12 is formed in a taper shape as described above, the area of the reflecting electrode RE can made larger than the area of the bottom electrode E1 exposed from the opening OP. Thus, the area in which the organic layer OR3 is in contact with the reflecting electrode RE is enlarged compared to the contact area of the organic layer OR3 and the bottom electrode E1 when they are in contact with each other. In this way, the area which contributes to light emission in the display element can be also enlarged.

Thickness TAD of the adhesive layer AD is greater than both thickness TE1 of the bottom electrode E1 and thickness TRE of the reflecting electrode RE. For example, thickness TAD is 10 to 100 μm, and thickness TE1 is greater than or equal to 10 nm, and thickness TRE is 150 to 300 nm.

The organic layer OR3 is provided on the reflecting electrode RE and is in contact with the reflecting electrode RE. The stacked layer body of the reflecting electrode RE and the organic layer OR3 is located in the upper side compared to the insulating layer 12. The organic layer OR3 includes the buffer layer CA1 and the buffer layer CA2 in addition to the light emitting layer EL3 as explained with reference to FIG. 2. The buffer layer CA1 is located between the reflecting electrode RE and the light emitting layer EL3.

As described above, when the emission colors of the organic layer OR1, the organic layer OR2 and the organic layer OR3 are different from each other, the light emitting layer EL1, the light emitting layer EL2 and the light emitting layer EL3 are formed of different materials. It should be noted that, when the emission colors of the organic layer OR1, the organic layer OR2 and the organic layer OR3 are the same as each other, the light emitting layer EL1, the light emitting layer EL2 and the light emitting layer EL3 are formed of the same material.

Each of the organic layer OR1 and the organic layer OR2 is spaced apart from the organic layer OR3.

The insulating layer 13 is provided on the insulating layer 12 and is in contact with the insulating layer 12. The insulating layer 13 covers each of a side surface RES of the reflecting electrode RE and a side surface ORS of the organic layer OR3. The insulating layer 13 is provided in each area located between adjacent reflecting electrodes RE and each area located between adjacent organic layers (for example, between the organic layer OR1 and the organic layer OR3 and between the organic layer OR2 and the organic layer OR3 in the figure).

In the example shown in the figure, the insulating layer 13 protrudes to the upper side compared to the buffer layer CA2 and covers the peripheral portion of the upper surface ORT of the organic layer OR3. It should be noted that the insulating layer 13 covers, of the side surface ORS of the organic layer OR3, at least a side surface ELS of the light emitting layer EL3. Thus, the insulating layer 13 may be depressed with respect to the upper surface ORT.

This insulating layer 13 may be either an organic insulating layer or an inorganic insulating layer.

The top electrode E2 is provided on the organic layer OR3 and the insulating layer 13. The top electrode E2 is in contact with the upper surface ORT of the organic layer OR3 inside the area surrounded by the insulating layer 13. The top electrode E2 is also provided on the organic layer OR1, the organic layer OR2 and the insulating layer 13. Thus, the top electrode E2 is continuously provided over the display element 21, the display element 22 and the display element 23. This top electrode E2 may be referred to as a common electrode, a counter electrode or a cathode. It should be noted that the top electrode E2 may comprise openings each overlapping the insulating layer 13 between the organic layers OR1, OR2 and OR3.

The top electrode E2 is, for example, a transflective metal electrode formed of a metal material such as magnesium or silver. The top electrode E2 may be a transparent electrode formed of a transparent conductive material such as ITO or IZO. The top electrode E2 may be a stacked layer body of a transparent electrode and a metal electrode.

The top electrode E2 is covered with a light extraction layer (not shown). Alternatively, the top electrode E2 is covered with a sealing layer provided on a light extraction layer (not shown). It should be noted that a light extraction layer may not be provided.

Figure 4:
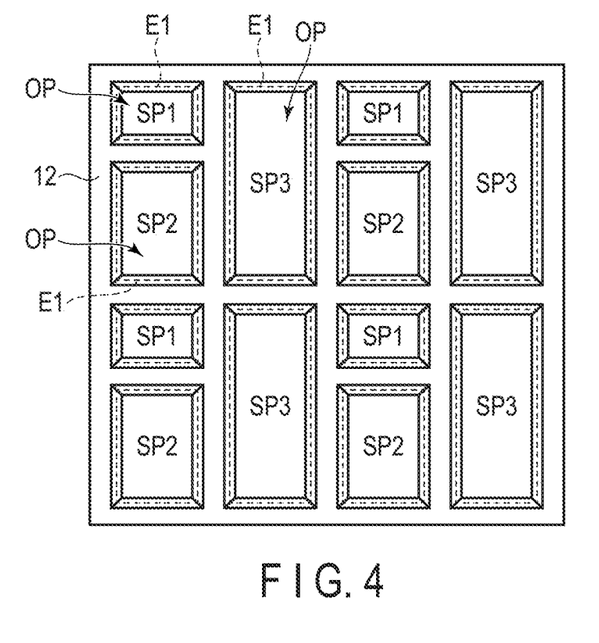
FIG. 4 is a plan view showing an example of the shape of an insulating layer 12.

FIG. 4 is a plan view showing an example of the shape of the insulating layer 12.

The bottom electrode E1 shown by dotted lines is provided in each of subpixels SP1, SP2 and SP3. In each of subpixels SP1, SP2 and SP3, the insulating layer 12 comprises the opening OP which penetrates to the bottom electrode E1. The insulating layer 12 is formed in a grating shape surrounding each bottom electrode E1.

Figure 5:
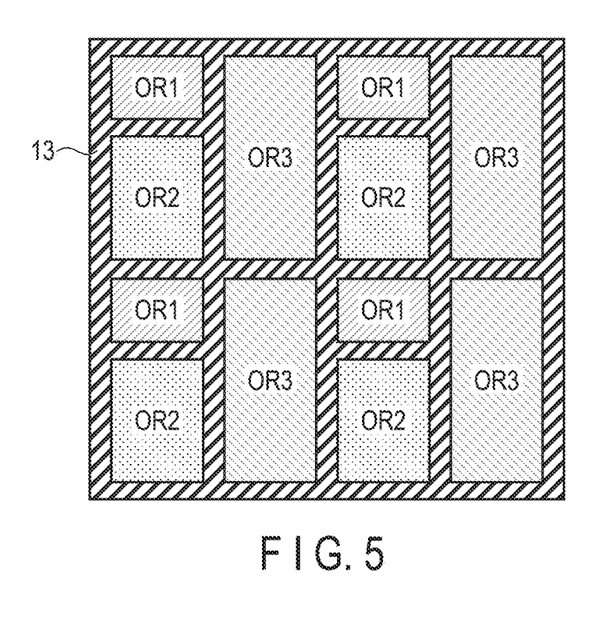
FIG. 5 is a plan view showing an example of the shape of an insulating layer 13.

FIG. 5 is a plan view showing an example of the shape of the insulating layer 13.

Figure 6:
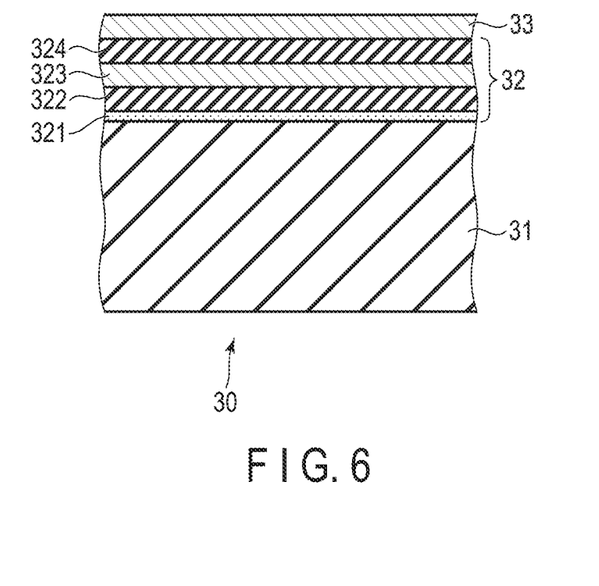
FIG. 6 is a cross-sectional view showing an example of a sheet 30 which can be applied to manufacture the display device DSP according to the embodiment.

The insulating layer 13 overlaps the insulating layer 12 shown in FIG. 4 and is formed in a shape similar to that of the insulating layer 12. Thus, the insulating layer 13 is formed in a grating shape surrounding each of the organic layers OR1, OR2 and FIG. 6 is a cross-sectional view showing an example of a sheet 30 which can be applied to manufacture the display device DSP according to the present embodiment.

The sheet (transfer sheet) 30 comprises a support body 31, an organic layer 32 stacked in the support body 31, and a reflecting electrode 33 stacked in the organic layer 32. The organic layer 32 and the reflecting electrode 33 are transfer layers which are transferred to the display device side in a transfer step.

The organic layer 32 comprises an electron injection layer 321 which is in contact with the support body 31, a functional layer 322 stacked in the electron injection layer 321, a light emitting layer 323 stacked in the functional layer 322, and a functional layer 324 stacked in the light emitting layer 323. The reflecting electrode 33 is stacked in the functional layer 324.

Figure 15:
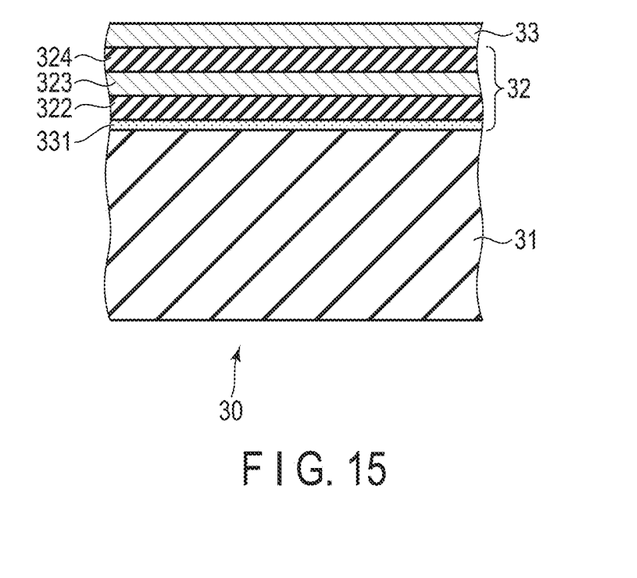
FIG. 15 is a cross-sectional view showing another example of the sheet 30.

The support body 31 is, for example, a resinous film. The electron injection layer 321 is formed of lithium fluoride. The electron injection layer 321 and the functional layer 322 form the buffer layer CA2 shown in FIG. 3. The light emitting layer 323 forms one of the light emitting layers EL1 to EL3 shown in FIG. 3. The functional layer 324 forms the buffer layer CA1 shown in FIG. 3. The reflecting electrode 33 forms the reflecting electrode RE shown in FIG. 3. It should be noted that, as explained in FIG. 2, the electron injection layer 321 may be omitted. In this case, as shown in FIG. 15, a support body peeling layer 331 may be provided in place of the electron injection layer 321. A material such as lithium fluoride should be preferably used for the support body peeling layer 331.

Now, this specification explains a manufacturing method of the display device DSP described above with reference to FIG. 7 to FIG. 10. In each figure, the illustration of the structure of the portion located under the insulating layer 11 is omitted.

Figure 7:
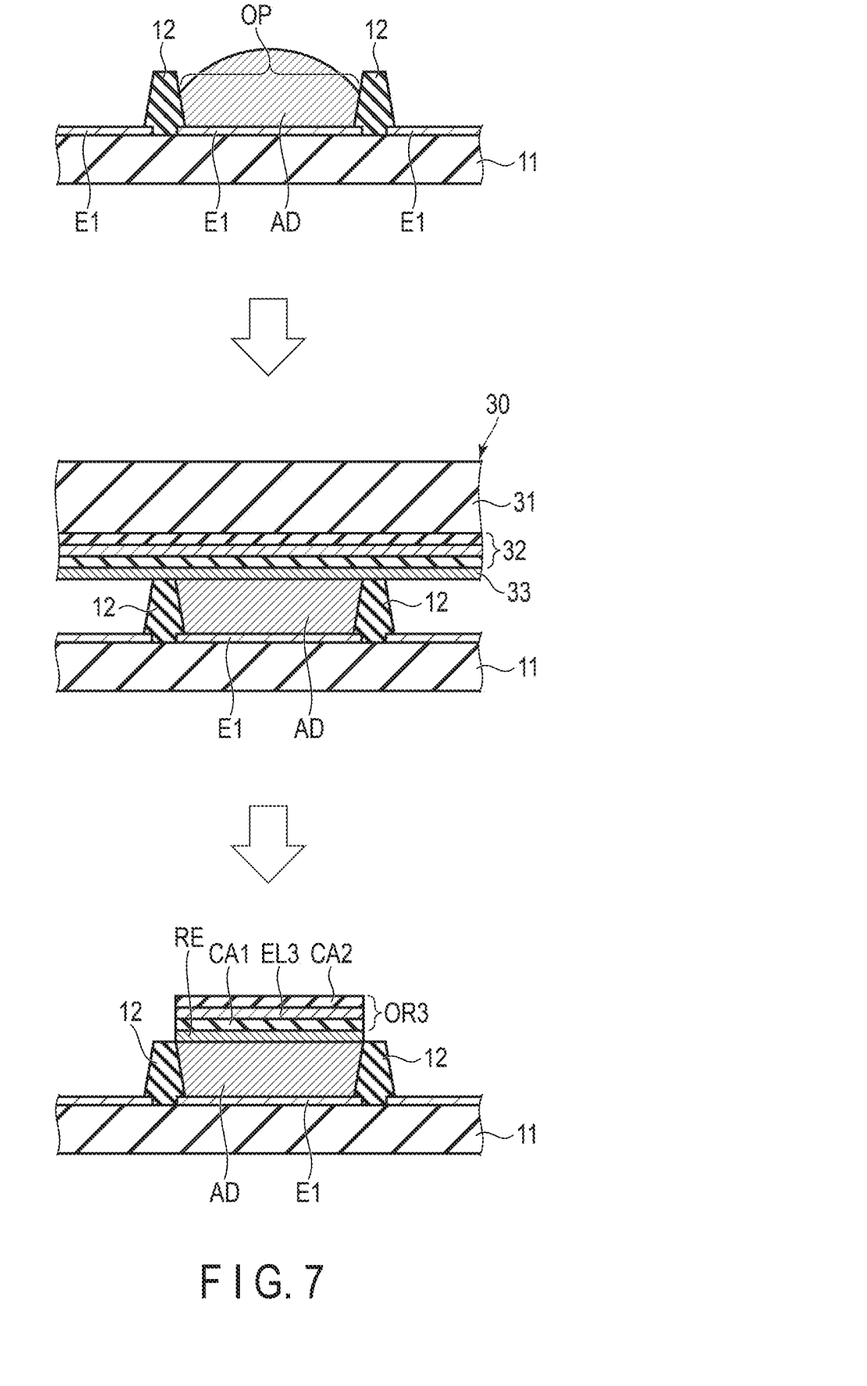
FIG. 7 is a diagram for explaining a manufacturing method of the display device DSP.

First, as shown in the upper stage of FIG. 7, the bottom electrode E1 is formed on the insulating layer 11, and subsequently, the insulating layer 12 comprising the opening OP penetrating to the bottom electrode E1 is formed. Subsequently, the opening OP is filled with the adhesive layer AD having conductivity.

Subsequently, as shown in the middle stage of FIG. 7, the sheet 30 is prepared and is attached such that the reflecting electrode 33 is in contact with the adhesive layer AD.

Subsequently, as shown in the lower stage of FIG. 7, of the sheet 30, the support body 31 is peeled off. At this time, of the sheet 30, the portion attached by the adhesive layer AD is transferred onto the adhesive layer AD, and the portion which does not overlap the adhesive layer AD is peeled off together with the support body 31. By this process, the reflecting electrode RE and the organic layer OR3 stacked in the adhesive layer AD are formed. It should be noted that, when the organic layer 32 comprises a lithium fluoride layer (an electron injection layer or a support body peeling layer) which is in contact with the support body 31 as explained with reference to FIG. 6, since the wettability of lithium fluoride for the support body 31 is small, it can be easily peeled off from the support body 31.

In the above descriptions, this specification explains the steps for forming the organic layer OR3. The organic layer OR1 and the organic layer OR2 can be formed by repeating the same steps as the steps for forming the organic layer OR3.

Figure 8:
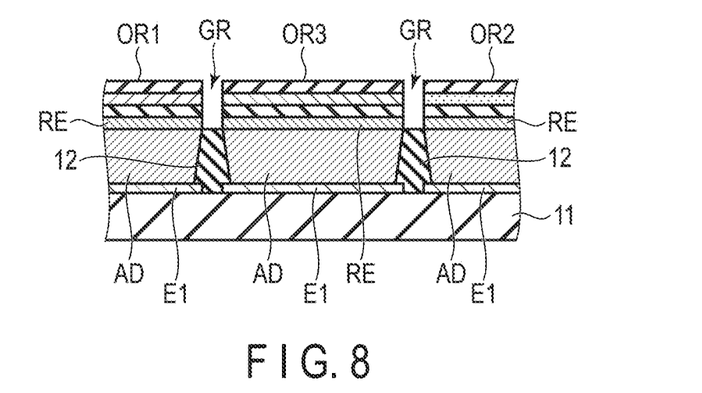
FIG. 8 is a diagram for explaining the manufacturing method of the display device DSP.

As shown in FIG. 8, in a state where the organic layer OR1, the organic layer OR2 and the organic layer OR3 are formed, grooves GR are formed immediately above the insulating layer 12. Thus, the grooves GR are respectively formed between the organic layer OR1 and the organic layer OR3 and between the organic layer OR2 and the organic layer OR3.

Figure 9:
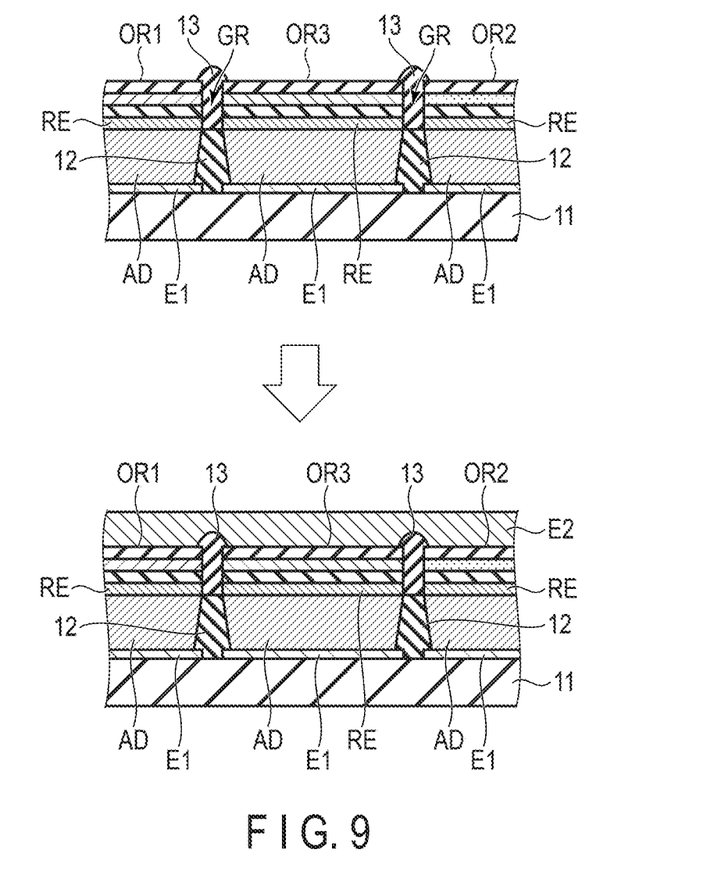
FIG. 9 is a diagram for explaining the manufacturing method of the display device DSP.

Subsequently, as shown in FIG. 9, the insulating layer 13 which covers the side surfaces of the organic layer OR3 and the reflecting electrode RE is formed. In other words, as shown in the upper stage of FIG. 9, an insulating material which is an organic material is put into the grooves GR or on the insulating layer 12, and subsequently, the insulating material is cured to form the insulating layer 13.

Subsequently, as shown in the lower stage of FIG. 9, the top electrode E2 is formed on the organic layer OR1, the organic layer OR2, the organic layer OR3 and the insulating layer 13. By this process, the display device DSP comprising the configuration shown in FIG. 3 is manufactured.

It should be noted that the method of forming the insulating layer 13 is not limited to the example shown in FIG. 9.

Figure 10:
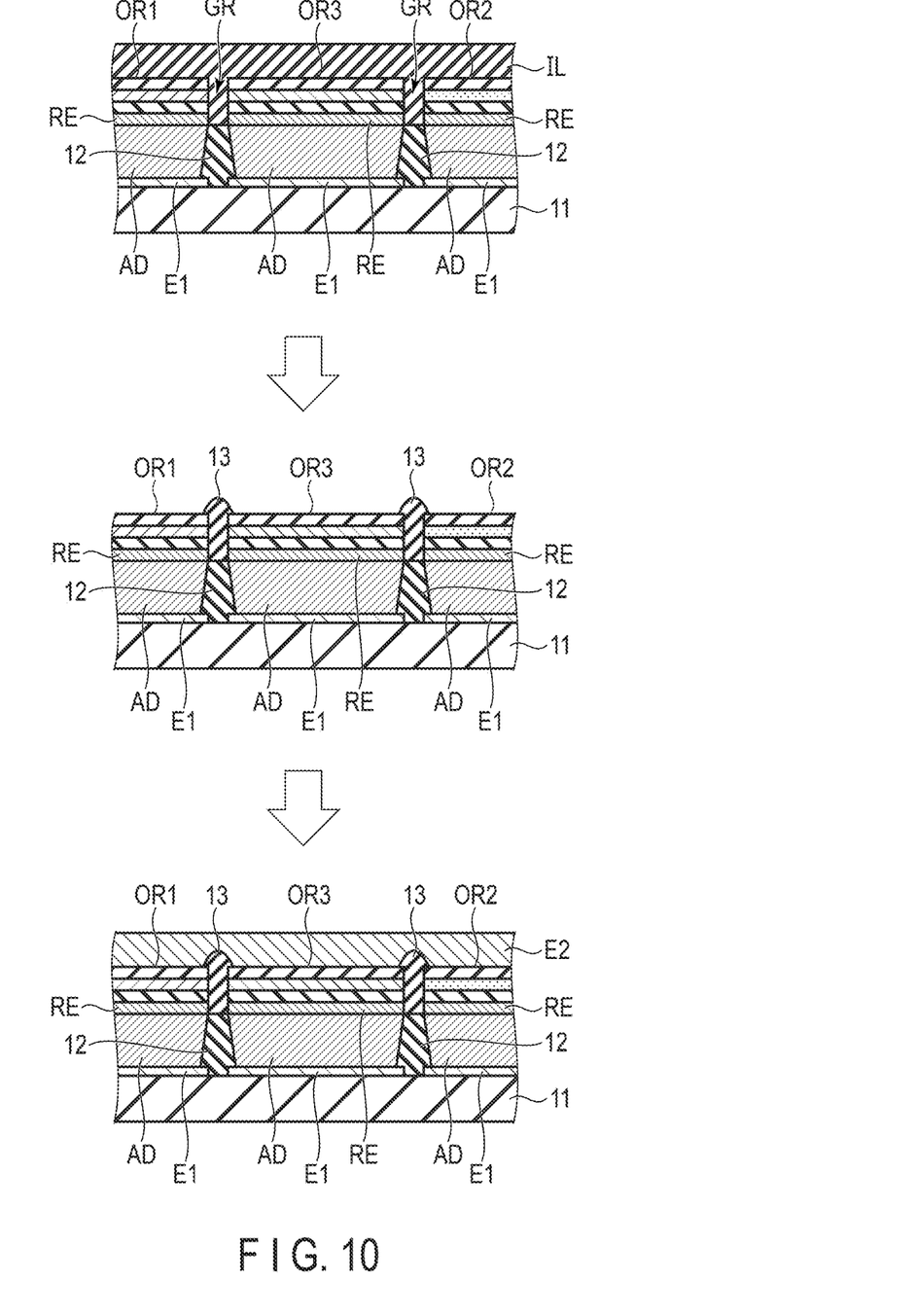
FIG. 10 is a diagram for explaining the manufacturing method of the display device DSP.

For example, as shown in the upper stage of FIG. 10, each of the insulating layer 12, the organic layer OR1, the organic layer OR2, the organic layer OR3 and the reflecting electrode RE is covered with an insulating material IL. The insulating material IL is, for example, an inorganic material. However, the insulating material IL may be an organic material.

Subsequently, as shown in the middle stage of FIG. 10, the insulating material IL is patterned such that the upper surface of each of the organic layers OR1, OR2 and OR3 is exposed. By this process, the insulating layer 13 overlapping the insulating layer 12 is formed.

Subsequently, as shown in the lower stage of FIG. 10, the top electrode E2 is formed on the organic layer OR1, the organic layer OR2, the organic layer OR3 and the insulating layer 13. By this process, the display device DSP comprising the configuration shown in FIG. 3 is manufactured.

As explained above, the organic layers OR having a desired shape can be formed without the intervention of a fine mask. Compared to a case where a fine mask is applied, the manufacturing cost can be reduced.

Further, a step for the positional adjustment of a fine mask is unnecessary. Thus, the organic layers OR having a desired shape can be easily formed.

Since the side surface RES of each reflecting electrode RE and the side surface ORS of each organic layer OR are covered with the insulating layer 13, a short circuit between adjacent pixel electrodes or between adjacent organic layers OR can be prevented.

Further, in the transfer sheet, as a layer which is in contact with the support body 31, the layer (an electron injection layer or a lithium fluoride layer) having a small wettability for the support body 31 is provided. By this configuration, in the step for transferring the transfer layer, it is unnecessary to apply transfer energy such as light or heat to a tiny area of a subpixel unit. In this way, the reduction in the manufacturing yield can be prevented.

Now, this specification explains layout examples of subpixels SP1 to SP3.

Figure 11:
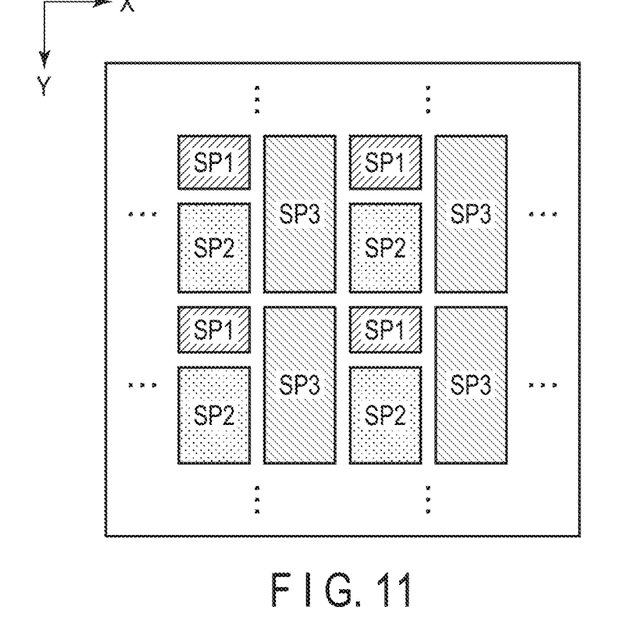
FIG. 11 is a plan view showing an example of the layout of subpixels SP1 to SP3.

FIG. 11 is a plan view showing an example of the layout of subpixels SP1 to SP3.

The subpixel SP1 of red is formed in substantially a rectangular shape extending in the first direction X. The subpixel SP2 of green and the subpixel of blue SP3 are formed in substantially a rectangular shape extending in the second direction Y. The area of the subpixel SP2 is greater than that of the subpixel SP1. The area of the subpixel SP3 is greater than that of the subpixel SP2. It should be noted that the area of the subpixel SP1 may be the same as that of the subpixel SP2.

The subpixel SP1 and the subpixel SP3 are arranged in the first direction X. The subpixel SP2 and the subpixel SP3 are arranged in the first direction X. Subpixels SP1 and SP2 are alternated in the second direction Y. Subpixels SP3 are adjacent to each other in the second direction Y.

Figure 12:
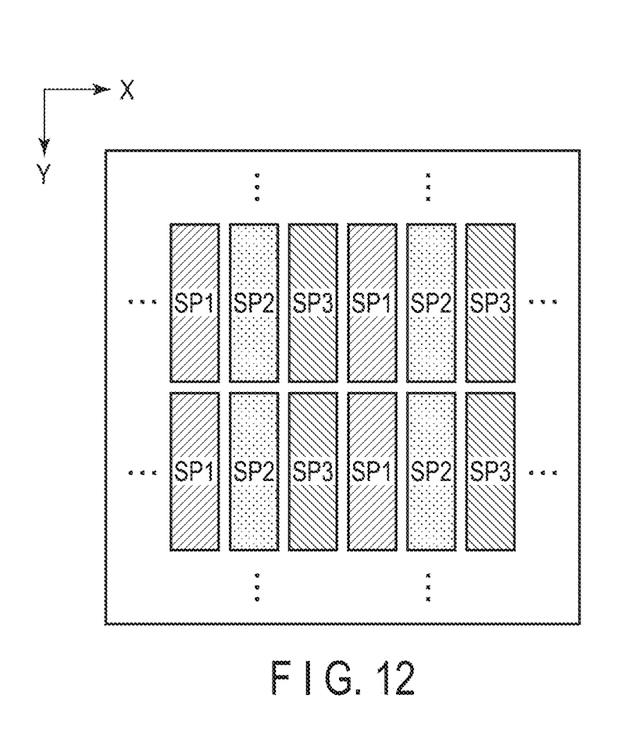
FIG. 12 is a plan view showing another example of the layout of subpixels SP1 to SP3.

FIG. 12 is a plan view showing another example of the layout of subpixels SP1 to SP3.

The subpixel SP1 of red, the subpixel SP2 of green and the subpixel SP3 of blue are formed in substantially a rectangular shape extending in the second direction Y. The subpixel SP1, the subpixel SP2 and the subpixel SP3 have substantially the same area.

The subpixel SP1, the subpixel SP2 and the subpixel SP3 are arranged in this order in the first direction X. Subpixels SP1 are adjacent to each other in the second direction Y. Subpixels SP2 are adjacent to each other in the second direction Y. Subpixels SP3 are adjacent to each other in the second direction Y.

Figure 13:
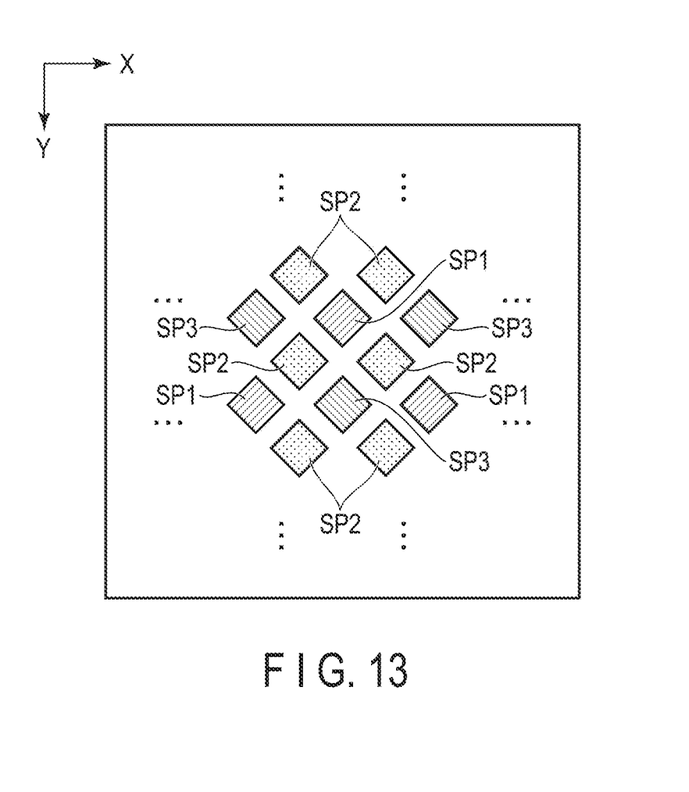
FIG. 13 is a plan view showing another example of the layout of subpixels SP1 to SP3.

FIG. 13 is a plan view showing another example of the layout of subpixels SP1 to SP3.

The subpixel SP1 of red, the subpixel SP2 of green and the subpixel SP3 of blue are formed in substantially a square shape. The subpixel SP1, the subpixel SP2 and the subpixel SP3 have substantially the same area.

Subpixels SP1 and SP3 are alternated in the first direction X. Subpixels SP2 are adjacent to each other in the first direction X.

Subpixels SP1 and SP3 are alternated in the second direction Y. Subpixels SP2 are adjacent to each other in the second direction Y. In an oblique direction intersecting with each of the first direction X and the second direction Y, subpixels of different colors are adjacent to each other.

Figure 14:
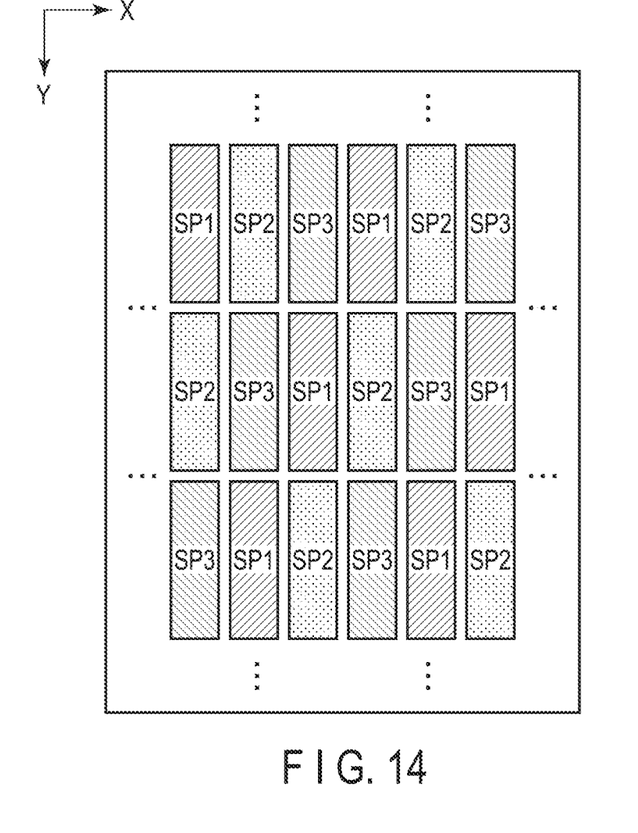
FIG. 14 is a plan view showing another example of the layout of subpixels SP1 to SP3.

FIG. 14 is a plan view showing another example of the layout of subpixels SP1 to SP3.

The subpixel SP1 of red, the subpixel SP2 of green and the subpixel SP3 of blue are formed in substantially a rectangular shape extending in the second direction Y. The subpixel SP1, the subpixel SP2 and the subpixel SP3 have substantially the same area.

The subpixel SP1, the subpixel SP2 and the subpixel SP3 are arranged in this order in the first direction X.

The subpixel SP1, the subpixel SP2 and the subpixel SP3 are arranged in this order in the second direction Y. In each of the first direction X and the second direction Y, subpixels of different colors are adjacent to each other.

In the display device DSP having the layout shown in each of FIG. 11 to FIG. 14, similarly, the above embodiment can be applied. It should be noted that the colors of the subpixels in the examples of FIG. 11 to FIG. 14 are merely examples and are not limited to these examples. In this respect, subpixels SP1, SP2 and SP3 should have different display colors.

The present embodiment described above can provide a display device which can prevent the reduction in yield, and a manufacturing method of the display device.

All of the display devices and the manufacturing methods thereof that can be implemented by a person of ordinary skill in the art through arbitrary design changes to the display device and the manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A display device comprising:
an insulating substrate;
a first insulating layer provided on the insulating substrate;
a bottom electrode provided on the first insulating layer;
a second insulating layer provided on the first insulating layer and comprising an opening penetrating to the bottom electrode;
an adhesive layer provided in the opening, having conductivity and being in contact with the bottom electrode;
a reflecting electrode attached to the adhesive layer;
an organic layer including a light emitting layer and provided on the reflecting electrode;
a third insulating layer provided on the second insulating layer, and covering a side surface of the reflecting electrode and a side surface of the organic layer; and
a top electrode provided on the organic layer and the third insulating layer.

2. The display device of claim 1, wherein
the second insulating layer is formed in a grating shape surrounding the bottom electrode in plan view, and
the third insulating layer is formed in a grating shape surrounding the organic layer in plan view.

3. The display device of claim 2, wherein
the third insulating layer covers a peripheral portion of an upper surface of the organic layer, and
the top electrode is in contact with the upper surface of the organic layer inside an area surrounded by the third insulating layer.

4. The display device of claim 1, wherein
the second insulating layer and the third insulating layer are organic insulating layers.

5. The display device of claim 1, wherein
the second insulating layer is an organic insulating layer, and
the third insulating layer is an inorganic insulating layer.

6. The display device of claim 1, wherein
a thickness of the adhesive layer is greater than both a thickness of the bottom electrode and a thickness of the reflecting electrode.

7. The display device of claim 1, wherein
the organic layer further includes an electron injection layer which is in contact with the top electrode.

8. The display device of claim 7, wherein
the electron injection layer is formed of lithium fluoride.

9. A manufacturing method of a display device, the method comprising:
forming a second insulating layer comprising an opening penetrating to a bottom electrode on a first insulating layer;
filling the opening with an adhesive layer having conductivity;
preparing a sheet in which an organic layer including a light emitting layer and a reflecting electrode are stacked in this order on a support body;
attaching the sheet such that the reflecting electrode is in contact with the adhesive layer;
peeling off the support body;
forming a third insulating layer covering a side surface of each of the organic layer and the reflecting electrode; and
forming a top electrode on the organic layer and the third insulating layer.

10. The method of claim 9, wherein
the forming the third insulating layer includes putting an insulating material on the second insulating layer.

11. The method of claim 10, wherein
the insulating material is an organic material.

12. The method of claim 9, wherein
the forming the third insulating layer includes:
covering the second insulating layer, the organic layer and the reflecting electrode with an insulating material; and
patterning the insulating material such that an upper surface of the organic layer is exposed.

13. The method of claim 12, wherein
the insulating material is an inorganic material.

14. The method of claim 9, wherein
the organic layer further includes an electron injection layer which is in contact with the support body.

15. The method of claim 14, wherein
the electron injection layer is formed of lithium fluoride.

* * * * *